United States Patent [19]
Narozny et al.

[11] 4,257,028
[45] Mar. 17, 1981

[54] REMOTE SOCKET FOR DIP COMPONENTS

[75] Inventors: Ronald S. Narozny, Panorama City; Albert H. Wilson, Los Angeles, both of Calif.

[73] Assignee: Thomas & Betts Corporation, Raritan, N.J.

[21] Appl. No.: 52,630

[22] Filed: Jun. 27, 1979

[51] Int. Cl.³ .................. H01R 11/20; H02B 1/04; H05K 7/10
[52] U.S. Cl. .................. 339/126 R; 339/17 CF; 339/17 F; 339/99 R
[58] Field of Search .............. 339/17 CF, 17 F, 91 R, 339/126 R, 128, 176 MF, 179, 99 R; 248/27.3; 179/52 CP, 1.7 F

[56] References Cited

U.S. PATENT DOCUMENTS

| | | | |
|---|---|---|---|
| 2,889,125 | 6/1959 | Hart | 248/27.3 |
| 3,273,104 | 9/1966 | Krol | 339/128 |
| 3,366,729 | 1/1968 | Pauza | 339/126 R X |
| 3,434,093 | 3/1969 | Wedekind | 339/17 F |
| 3,446,467 | 5/1969 | Bailey et al. | 339/128 X |
| 3,571,780 | 3/1971 | Boenning et al. | 339/174 X |
| 3,643,132 | 2/1972 | Odmark | 339/126 R X |
| 3,651,446 | 3/1972 | Sadogierski et al. | 339/91 R |
| 3,721,941 | 3/1973 | Wisser | 339/17 CF |
| 3,725,842 | 4/1973 | Fridberg | 339/126 R X |
| 3,731,254 | 5/1973 | Key | 339/17 CF |
| 3,794,278 | 2/1974 | Faey et al. | 248/27.3 |
| 3,795,885 | 3/1974 | Desso et al. | 339/17 F |
| 3,964,816 | 6/1976 | Narozny | 339/99 R |
| 3,994,554 | 11/1976 | Navarro | 339/99 R |
| 4,006,957 | 2/1977 | Narozny | 339/103 M |
| 4,009,921 | 3/1977 | Narozny | 339/99 R |
| 4,025,141 | 5/1977 | Theussen | 339/99 R |
| 4,027,941 | 6/1977 | Narozny | 339/14 R |
| 4,030,799 | 6/1977 | Venaleck | 339/99 R |
| 4,068,912 | 1/1978 | Hudson et al. | 339/99 R |
| 4,190,952 | 3/1980 | Thomas et al. | 339/99 R X |

*Primary Examiner*—Eugene F. Desmond
*Attorney, Agent, or Firm*—James J. Daley; Robert M. Rodrick; Jesse Woldman

[57] ABSTRACT

A remote socket for a DIP component composed of a panel mounting means for mounting in a console panel or the like, a socket in said panel mounting means to accept the DIP component, a first connector coupled to the panel mounting means and adjacent the socket to also receive the DIP component, a second connector at the desired location on a printed circuit board or the like and cable connecting said first and second connectors. Various panel mounting means and means to couple the connector to the panel mounting means are described.

3 Claims, 17 Drawing Figures

REMOTE SOCKET FOR DIP COMPONENTS

BACKGROUND OF THE INVENTION

1. Field of the Invention

The invention relates to the remote controlling of DIP switches and other components on printed circuit boards within electronic equipment consoles.

2. Description of the Prior Art

According to the prior art, when it was necessary to reset printed circuit board components such as DIP switches it was necessary to open the electronic equipment console and remove the printed circuit board or it was necessary to mount the component directly on the outside of the electronic equipment console. In either case the arrangement was generally undesirable.

SUMMARY OF THE INVENTION

The present invention overcomes the difficulties related above with respect to prior art techniques for handling enclosed settable circuit components and controls by providing an arrangement whereby the needed components can be easily remoted from the printed circuit board in the equipment console to the outside of console and which facilitates simple manipulation or replacement of components. It is an object of this invention to provide a remote socket for DIP components.

It is an object of this invention to provide a remote socket for DIP components mounted external to an electronic equipment console.

It is still another object of the invention to provide a remote socket for DIP components which permits remote manipulation of components associated with a printed circuit board within a housing.

Other objects and features of the invention will be pointed out in the following description and claims and illustrated in the accompanying drawings, which disclose, by way of example, the principles of the invention, and the best modes which have been contemplated for carrying them out.

BRIEF DESCRIPTION OF THE DRAWINGS

In the drawings in which similar elements are given similar reference characters.

Figure 1:
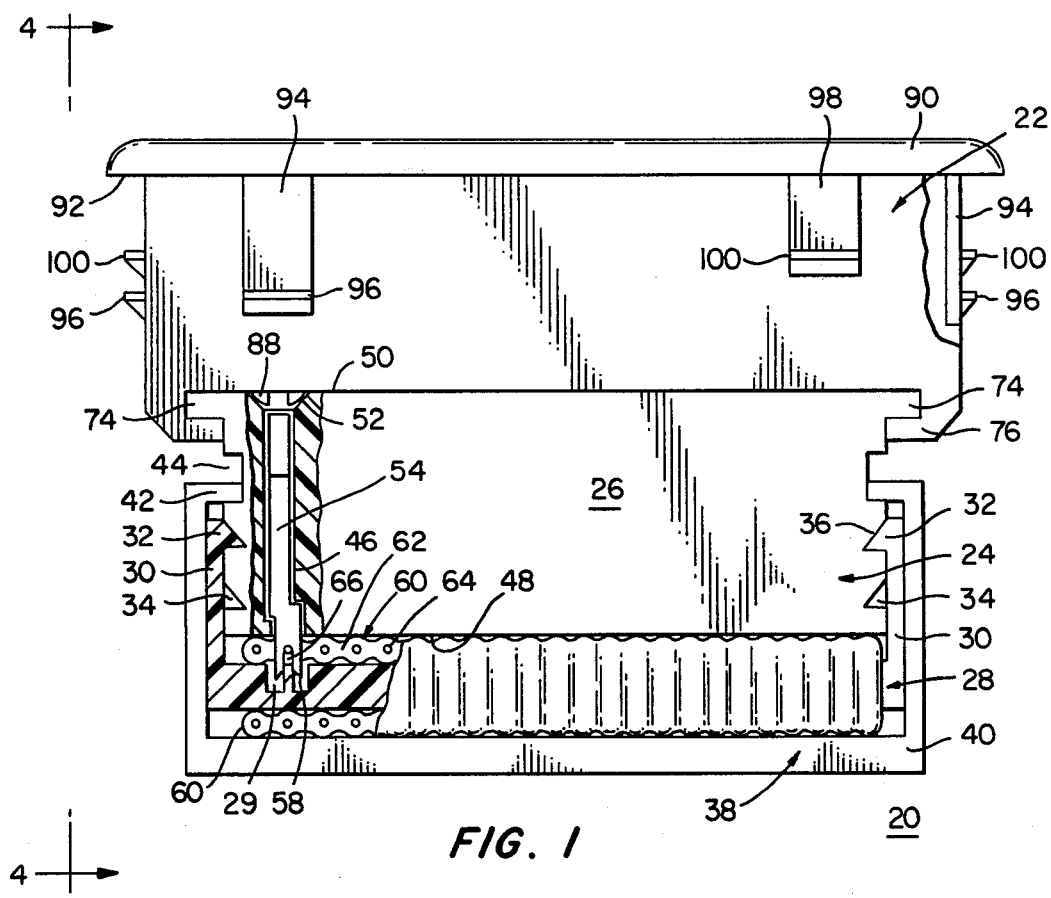
FIG. 1 is a side elevation of a first embodiment of a remote socket for DIP components constructed in accordance with the concepts of the invention.
Figure 2:
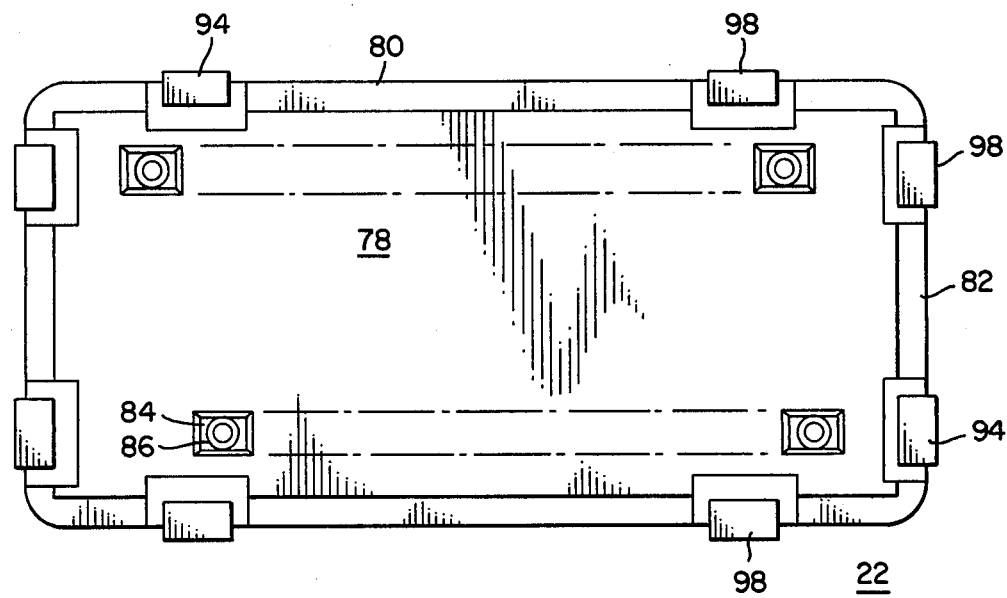
FIG. 2 is a top plan view of the remote socket of FIG. 1.

DESCRIPTION OF THE PREFERRED EMBODIMENT:

Turning now to FIGS. 1 to 4 there is shown a remote socket 20 for DIP components constructed in accordance with the concepts of the invention. Socket 20 has a panel retaining portion 22 and a connector 24. Connector 24 is substantially as shown in U.S. Pat. No. 4,006,957 issued Feb. 8, 1977 to Ronald S. Narozny entitled "Connector" and assigned to the assignee of the instant invention. Connector 24 is made up of a body 26, a cover 28 which has extending arms 30 terminating in inturned nibs 32 which lock with recesses 34 or 36. A strain relief 38 overlies the cover 28 and has extending arms 40 with inturned nibs 42 which lock in recesses 44.

Figure 5:
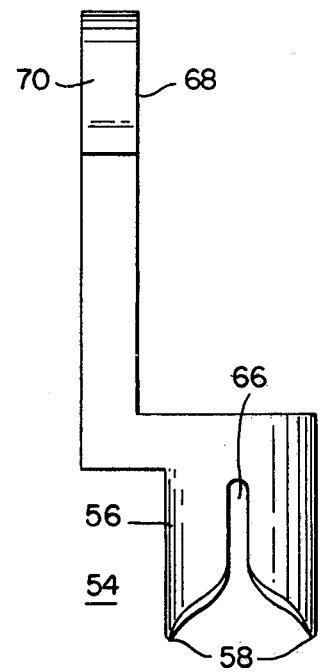
FIG. 5 is a front elevation of the contact employed in the connector of FIG. 1.
Figure 6:
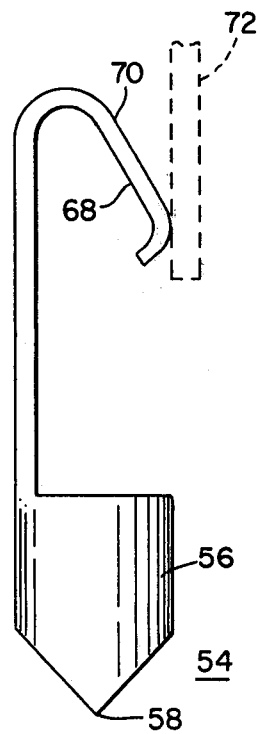
FIG. 6 is a side elevation of the connector of FIG. 5.

Extending through body 26 are a plurality of bores 46 from surface 48 to surface 50. The bore 46 entrance at surface 50 is counterbored as at 52 to give a smooth entry to the bores 46. Within each of the bores 46 is an insulation piercing contact 54 substantially as shown in U.S. Pat. No. 3,964,816 issued June 22, 1976 to Ronald S. Narozny entitled "Electrical Contact" and assigned to the assignee of the instant invention. As is best seen in FIGS. 5 and 6, contact 54 has an insulation piercing end 56 made up of a cylinder sharpened to two points 58 used to pierce through the insulation 62 (see FIG. 1) of a flat cable 60 to make contact with the discrete parallel conductors 64 therein. A slot 66 is arranged to bite into and make good electrical contact with the discrete wires 64. A further slot (not visible) grips the insulation and provides strain relief for the joint of conductor 64 and contact 54.

To use the connector 24, the strain relief 38 is removed and the cover 28 is moved to a first position such that nibs 32 of arms 30 engage the recesses 34. This provides clearance for the flat cable 60 to be moved between the points 58 of the contacts 54 and the undersurface of cover 28. Cover 28 is now clamped downwardly causing the contacts 54 to pierce the flat cable 60 and enter the annular recesses 29 in the cover 28. The nibs 32 on the arms 30 advance to the recesses 36 and the connector 24 is now closed upon the flat cable 60 with a conductive path established between each conductor 64 and its associated contact 54. The flat cable 60 is now gently folded back across the outside of the cover 28 and the strain relief 38 is applied. The inturned nibs 42 of the strain relief arms 40 are made to engage the recesses 44 to apply a compressive force to the flat cable 60 against the cover 28 to prevent any forces applied to the flat cable 60 to be applied directly to the cable-contact joints.

Figure 4:
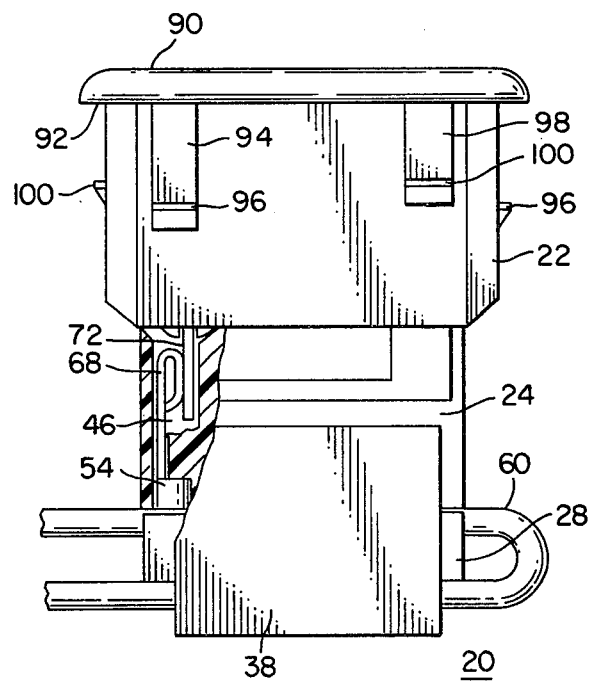
FIG. 4 is an end elevation, partially cut away and partially in section, of the socket of FIG. 1.

Returning to FIGS. 5 and 6, the contacts 54 have pin contact ends composed of a partially closed loop 68 having a contact face 70 for engagement with a pin 72 introduced into bore 46 adjacent the contact. The partially closed loop 68 format provides for a wiping of a pin 72 (shown in phantom line) inserted adjacent the contact 54 and insures a compliant good electrical contact therewith. A large pin 72 can cause the loop 68 to completely close as is shown in FIG. 4 with no harm to the contact 54.

Returning again to FIGS. 1 to 4, body 26, adjacent surface 50, has a series of extenders 74 to permit the connector 24 to be coupled to the panel retaining portion 22. Panel retaining portion 22 has a corresponding series of deflectable tabs 76 which in their normal position mate with the extenders 74 of body 26. If deflected outwardly, away from body 26, the body 26 and panel retaining portion 22 can be separated. Also, the extenders 74 and the tabs 76 can be arranged to permit the body 26 to be slid free of the portion 22 with proper assembly latches or the entire remote socket 20 formed integrally so that the panel retaining portion 22 and connector 24 are not separable. The panel retaining portion 22 has the general shape of an open box having a floor 78, two side walls 80 and two end walls 82. In the floor 78 are a series of square or rectangular openings 84 with appropriate lead-ins 86 to direct a pin 72 through the center of the opening 84. On the opposite surface of floor 78 are a series of projections 88 each of which mates with the lead-in 52 of the bores 46 so that pins 72 inserted into the openings 84 in floor 78 of the panel retaining portion 22 are directed into the connector 24 and adjacent the contact face 70 of the contact 54.

Surrounding the free end of the panel retaining portion 22 is a bezel 90 whose underside 92 rests on the front side of an electrical console panel or electrical equipment cabinet. The opposite side of the panel is engaged by deflectable tabs 94 which terminate in outwardly extending nibs 96. To accommodate a panel thickness less than that accommodated by the tabs 94, a second series of tabs 98 are provided with outwardly extending nibs 100. The nibs 96 and 100 have their leading edges tapered to deflect upon insertion into the knockout of a panel. The natural resilience of the material will outwardly return the tabs 94, 98 as soon as the nibs 96, 100 have passed the panel walls. As is evident from FIG. 2, each of the tabs 94, 98 are mounted on flexible portions of the bezel 90 so that they can be deflected and thus remove the nibs 96, 100 from engagement with the panel back surface to permit removal of the remote socket 20 from the panel.

Figure 9:
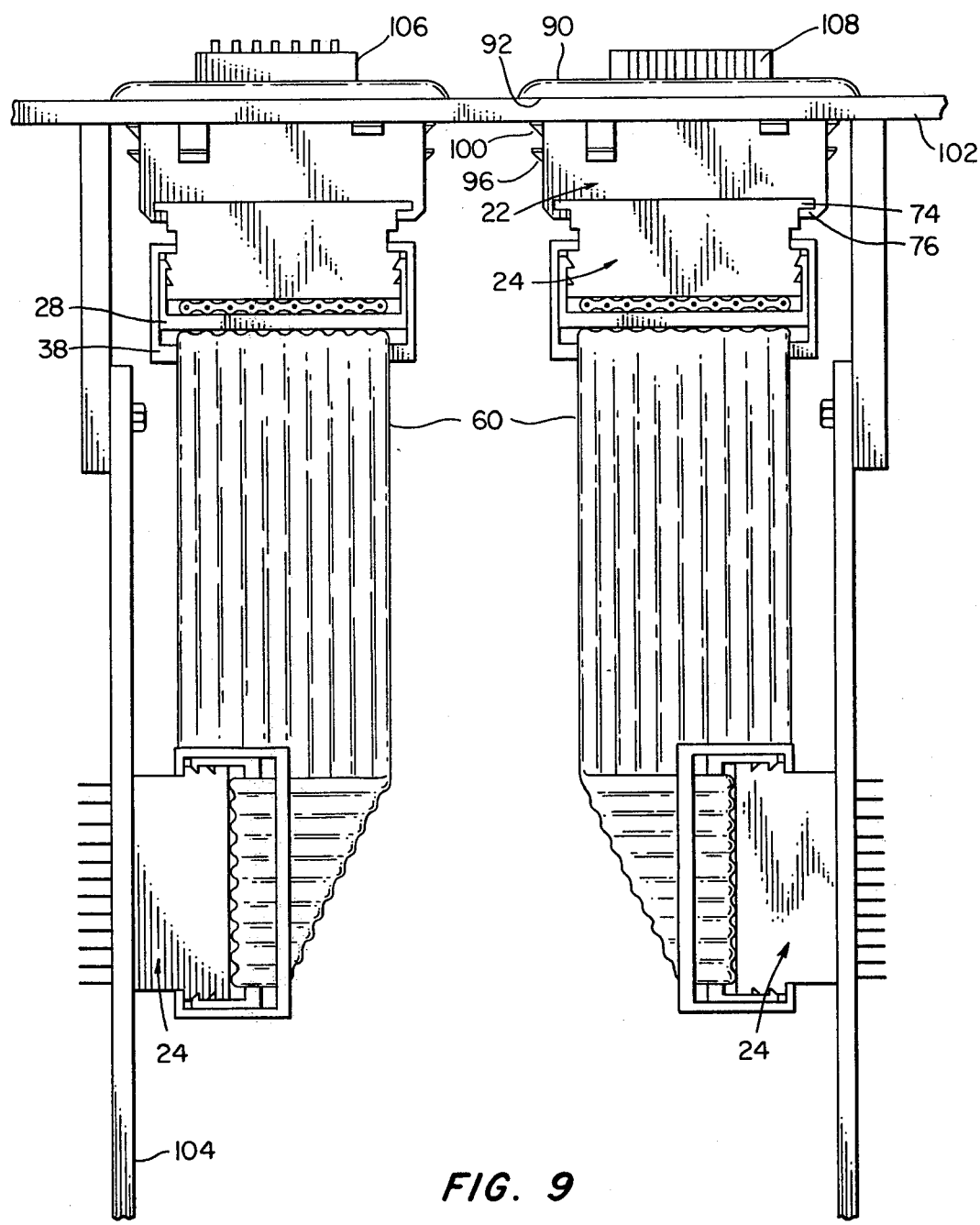
FIG. 9 is a side elevation of two remote sockets in use with printed circuit boards.

To use the remote socket 20 (see FIG. 9) a flat cable 60 is attached to the connector 24, as above described. Then the panel retaining portion 22 and the connector 24 are assembled and inserted, connector 24 first, into the knockout in a panel 102 until the underside 92 of bezel 90 contacts the front side of panel 102 and the outwardly extending nibs 96, 100, depending upon the panel 102 thickness, engage the back side of panel 102. Alternatively, the panel retaining portion 22 can be seated, as above described, and then connector 24 installed to the panel retaining portion 22 from behind the panel 102. The free end of the flat cable 60 is available for connection to a connector 24 on a printed circuit board 104 or the like supported by panel 102 so that any component required for the printed circuit board 104 circuitry can be remotely connected to socket 20 and its effect reflected in the printed circuit board 104 as if it were directly connected.

Figure 7:
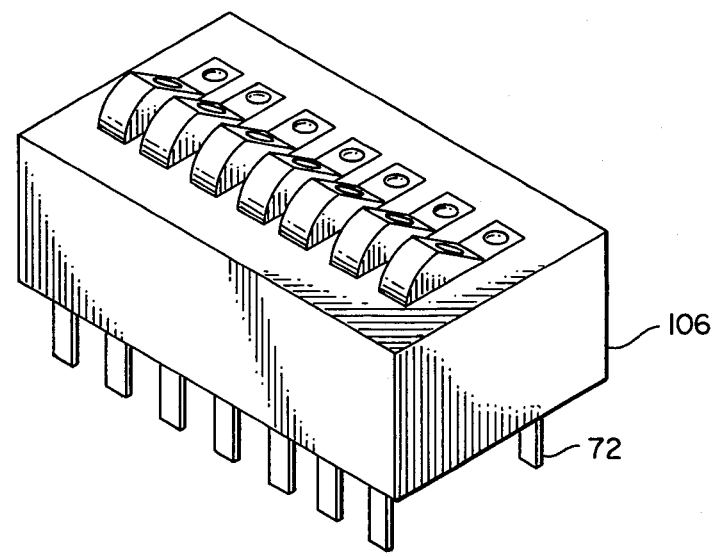
FIG. 7 is a front perspective view of a DIP switch which can be accommodated by the remote socket of FIG. 1.

The remote connection finds particular utility where the component to be placed remotely is a variable or adjustable one. Thus, where the component is a multiple channel switch 106 (see FIG. 7) used, for example, for programming, and any change in the program requires a changing of the switch 106, the ability to make the change to the switch 106 external to the equipment cabinet negates the need for disassembly of the printed circuit board from the enclosure and later reassembly once the change has been made.

Figure 8:
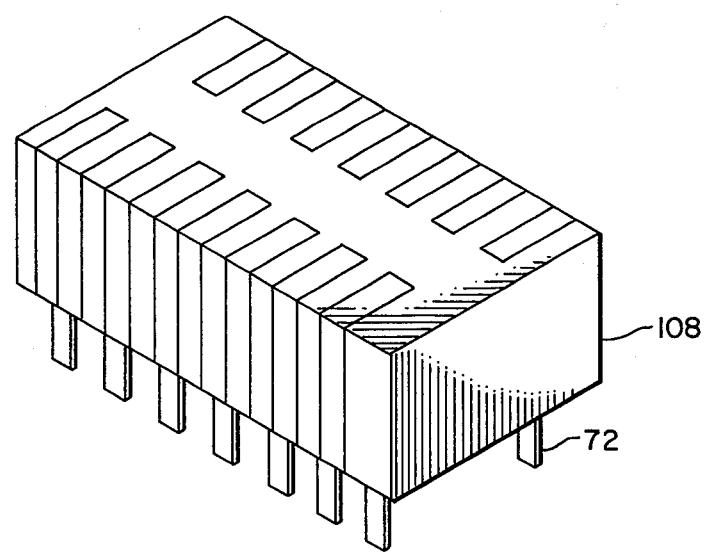
FIG. 8 is a front perspective view of a DIP memory package which can be accommodated by the remote switch of FIG. 1.

Similarly, memories such as 108 (see FIG. 8) can be inserted into the remote socket 20, as well as any other necessary or desirable component.

Figure 3:
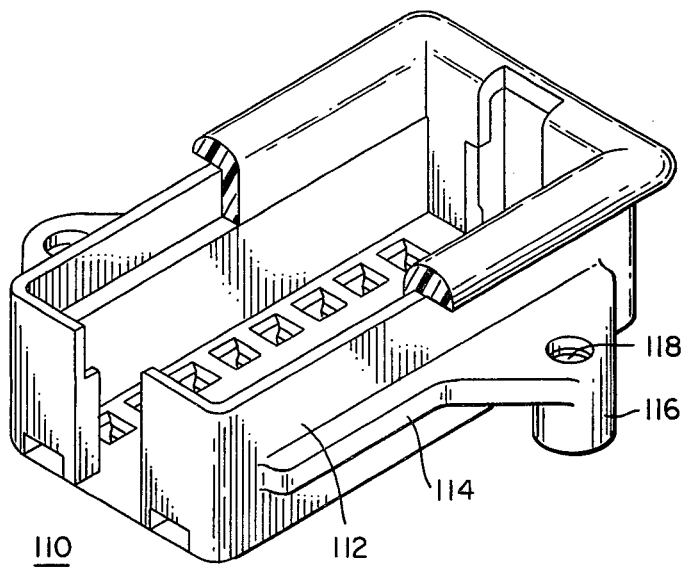
FIG. 3 is a front perspective view, partially cut away and partially in section, of an alternative embodiment of the remote socket of FIG. 1.

Panel retaining portion 110, as is shown in FIG. 3, may be mounted on or below a mounting panel. If surface mounted, portion 110 is positioned over a suitably dimensioned knockout and fasteners (not shown) are passed through apertures 118 in lugs 116 to fasten the portion 110 to the panel. To mount the panel retaining portion 110 below the panel, two choices are available. After positioning the portion 110 in a suitable knockout, fasteners (not shown) can be passed upwardly through apertures 118 in lugs 116 and into the panel. The bezel can then be added to the portion 110 to dress-up the installation. Alternatively, the panel can be trapped between the undersurface of the bezel and the upper surface of the lugs 116 to hold the panel retaining portion 110 to the panel.

Figure 11:
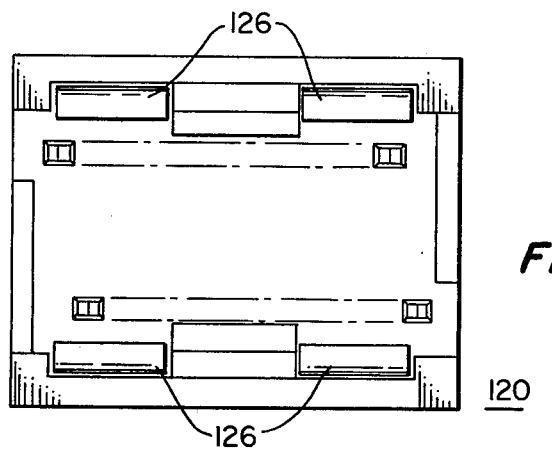
FIG. 11 is a top plan view of the remote socket of FIG. 10.
Figure 10:
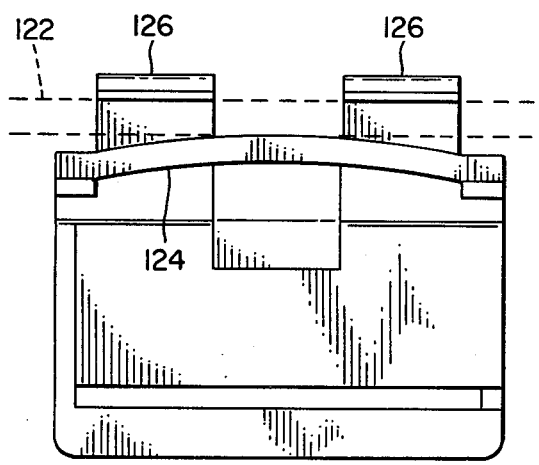
FIG. 10 is a front elevation of a further embodiment of a remote socket constructed in accordance with the concepts of the invention.
Figure 12:
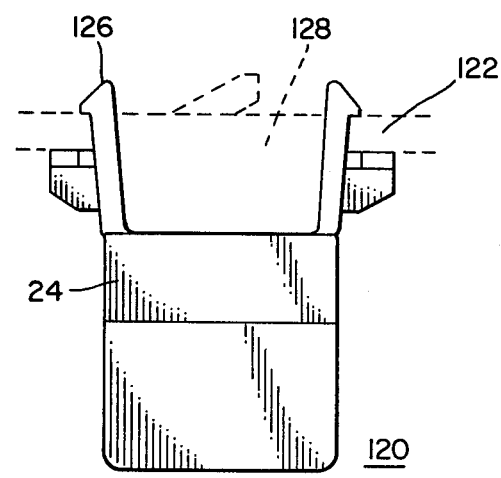
FIG. 12 is a side elevation of the remote socket of FIG. 10.

FIGS. 10, 11 and 12 show a remote socket 120 for insertion from the rear of a panel 122. Retainers 124 in the form of flat springs hold the panel 122 firmly between the retainers 124 and the hook portions of the four latch bars 126. If it is desired to remove the DIP component socket 128 from connector 24 and from panel 122 this can be done by removing any component in the DIP component socket 128 and releasing the four latch bars 126 in a direction towards the center of FIG. 12.

Figure 13:
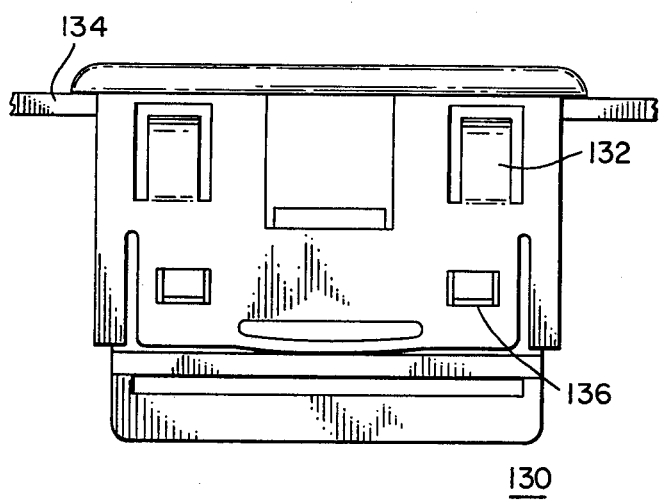
FIG. 13 is a front elevation of still another embodiment of a remote socket constructed in accordance with the concepts of the invention.
Figure 14:
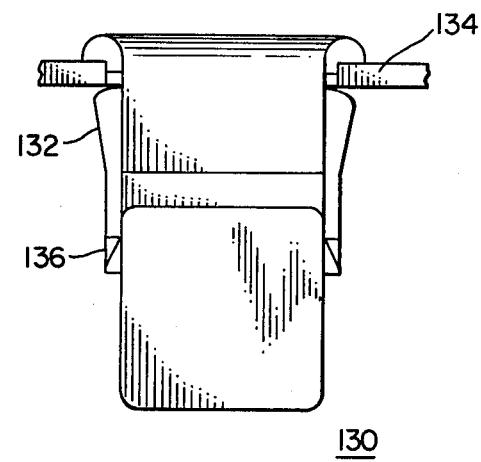
FIG. 14 is a side elevation of the remote socket of FIG. 13.

Referring to FIGS. 13 and 14, a further form of DIP component socket 130 is shown. The latches 132 to engage panel 134 open upwardly and outwardly from the body of socket 130 and are releasable from within socket 130 when any component has been removed from socket 130. The skirt 136 is flexible to permit deflection of the connector to socket latches 138 from the extenders 74 of the connector 24. A connector to socket retainer 140 applies a constant tension on connector 24 to keep it from moving and thus make the coupling more reliable.

Figure 15:
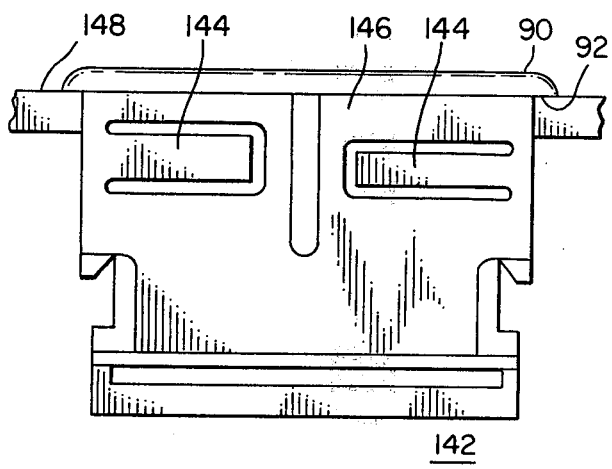
FIG. 15 is a front elevation of yet another embodiment of a remote socket constructed in accordance with the concepts of the invention.
Figure 16:
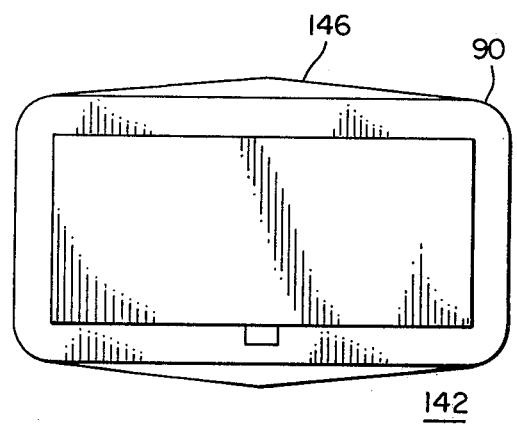
FIG. 16 is a top plan view of the remote socket of FIG. 15.

The remote socket 142 of FIGS. 15 and 16 have outwardly extending latches 144 and bowed side walls 146. As the socket 142 is inserted in a properly dimensioned knockout in panel 148 the bowed side walls 146 flex inwardly to square the socket 142 in the knockout and deflect the latches 144 inwardly. As the latches 144 pass the panel 148 thickness, the appropriate latch 144 is outwardly deflected to engage the rear surface of panel 148 and hold same between latches 144 and the underside 92 of bezel 90.

Figure 17:
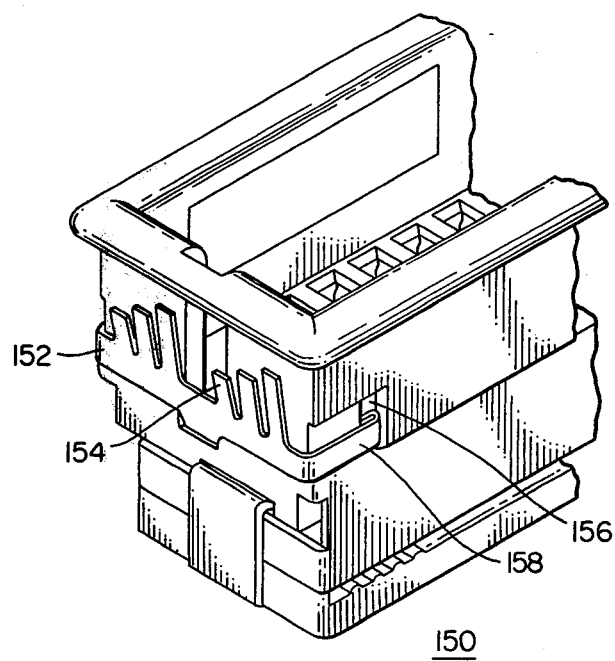
FIG. 17 is a fragmentary front perspective view, partially cut away and partially in section, of a further embodiment of a remote socket constructed in accordance with the concepts of the invention.

To provide for maximum flexibility in handling mounting panels of different thicknesses a metal retainer 152 having a series of spring fingers 154 of different lengths can be used with the DIP component socket 150 of FIG. 17. Recesses 156 receive the folded over ends 158 of the retainer 152 to hold same to the socket 150.

While there have been shown and described and pointed out the fundamental novel features of the invention as applied to the preferred embodiments, it will be understood that various omissions and substitutions and changes of the form and details of the devices illustrated and in their operation may be made by those skilled in the art, without departing from the spirit of the invention.

The embodiments of the invention in which an exclusive property or privilege is claimed are defined as follows:

1. In combination, for releasably mounting a DIP component in a console panel for control of circuitry located remotely from said console panel:

a socket comprising a retaining portion for mounting to said console panel and for releasably receiving such DIP component, said retaining portion defining a plurality of openings for passage of contacts of said DIP component therethrough and therebeyond;

an electrical connector having a body secured to said retaining portion and supporting contact elements in registry with said openings, each said contact element having a first end contact in interference disposition to such opening to compliantly electrically engage such DIP contact and a second end contact of insulation-piercing character and extending outwardly of said body; and a flat cable having multiple conductors, each conductor thereof being in insulation-pierced electrical connection with a distinct one of such connector second end contacts and in further electrical connection with said circuitry located remotely from said console panel.

2. The invention claimed in claim 1 wherein said retaining portion includes a bezel for engagement with a first surface of said control panel and at least one retaining arm for engagement with an opposed surface of said control panel.

3. The invention claimed in claim 1 wherein said retaining portion includes a bezel for engagement with a first surface of said control panel and two or more retaining arms for selective engagement with opposed surfaces of panels of different thicknesses.

* * * * *